(12) United States Patent
Khlat

(10) Patent No.: US 6,782,038 B1
(45) Date of Patent: Aug. 24, 2004

(54) METHOD AND APPARATUS FOR RADIO COMMUNICATIONS

(75) Inventor: Nadim Khlat, Cugnaux (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/364,289

(22) Filed: Jul. 30, 1999

(30) Foreign Application Priority Data

Jul. 30, 1998 (EP) .............................................. 98401954

(51) Int. Cl.$^7$ .............................................. H04B 1/707
(52) U.S. Cl. .................................................... 375/147
(58) Field of Search ................................ 375/130, 147, 375/316, 324, 295, 296, 285, 346; 332/103; 329/304, 306, 307; 455/324, 296, 310, 311

(56) References Cited

U.S. PATENT DOCUMENTS

| | | | | |
|---|---|---|---|---|
| 4,736,390 A | * | 4/1988 | Ward et al. .................. | 375/316 |
| 5,559,788 A | * | 9/1996 | Zsheile, Jr. et al. .......... | 370/206 |
| 5,564,097 A | * | 10/1996 | Swanke ....................... | 455/302 |
| 5,764,690 A | * | 6/1998 | Blanchard et al. .......... | 375/147 |
| 5,893,044 A | * | 4/1999 | King et al. .................. | 701/214 |
| 6,075,807 A | * | 6/2000 | Warren et al. ............... | 375/143 |
| 6,178,337 B1 | * | 1/2001 | Spartz et al. ................ | 455/561 |
| 6,335,922 B1 | * | 1/2002 | Tiedemann, Jr. et al. ... | 370/355 |
| 6,373,902 B1 | * | 4/2002 | Park et al. .................. | 375/296 |
| 6,389,060 B1 | * | 5/2002 | Naruse ........................ | 375/130 |

FOREIGN PATENT DOCUMENTS

| | | |
|---|---|---|
| EP | 0344467 A1 | 12/1989 |
| EP | 0848493 A1 | 6/1998 |
| GB | 2321354 A | 7/1998 |

* cited by examiner

Primary Examiner—Khai Tran
Assistant Examiner—Kevin M Burd

(57) ABSTRACT

A method (and apparatus) of receiving (and/or transmitting) a wanted modulated radio frequency signal with reduced locally generated noise. In the case of reception, the method comprises the steps of receiving a radio frequency signal 99; generating a high frequency local oscillator signal 71,72, which can be mathematically described as having a fixed frequency $\omega_{RF}$ responding to the frequency of the carrier wave of the wanted modulated radio frequency signal and a phase $\phi_{SS}$ which varies in time according to a predetermined local phase function; mixing the received radio frequency signal 99 with the high frequency local oscillator signal 71,72 to generate a mixed signal 111,116 so as to spread locally the band-width of the signal with which it is mixed. The mixed signal is then converted from an analogue signal into a digital signal 121,122. A low frequency local oscillator signal 61,62,63,64 is generated, which can be mathematically described as having a fixed frequency of zero and a phase $\phi_{SS}$ which varies in time according to the predetermined local phase function when delayed by a predetermined delay corresponding to the time taken for the signal to propagate between the first mixing step 110,115 and the second mixing step 300. The mixed signal is mixed with the low frequency local oscillator signal to recover a recovered signal 131,132 including both a despread wanted base-band signal whose phase is not dependent on the predetermined local phase function and a spread noise signal whose phase is dependent upon the predetermined local phase function. In the case of transmission, the signal to be transmitted is spread locally by a low frequency local oscillator signal and subsequently mixed in the transmitter with a high frequency local oscillator signal to recover a recovered signal including both a despread wanted RF signal whose phase is not dependent on the predetermined local phase function and a spread noise signal whose phase is dependent upon the predetermined local phase function.

12 Claims, 3 Drawing Sheets

METHOD AND APPARATUS FOR RADIO COMMUNICATIONS

FIELD OF THE INVENTION

The present invention relates to a method and apparatus for performing radio communication, and in particular to a portable communications device incorporating such a method or apparatus.

BACKGROUND OF THE INVENTION

Within most common radio communication protocols (e.g. Groupe Speciale Mobile—GSM), portable communication devices must be able to receive and transmit radio signals at a plurality of different radio frequencies which correspond to different channels (or groups of channels). In order to receive radio signals at different radio frequencies, conventional radio receivers have employed a superheterodyne receiver in which the incoming radio signal is mixed with a first locally generated signal whose frequency may be varied as desired. In this way it is possible to generate an in termediate frequency (IF) signal whose frequency is given approximately by $f_{IF}=f_{RF}-f_{LO}$ where $f_{IF}$ is the frequency of the IF signal, $f_{RF}$ is the frequency of the wanted radio signal and $f_{LO}$ is the frequency of the locally generated signal; since $f_{LO}$ may vary, it is always possible to choose an $f_{LO}$ such that $f_{IF}$ occupies a single frequency range regardless of the value of $f_{RF}$. Conventionally, within GSM portable communication devices, $f_{IF}$ is chosen to have a value such that the image ($f_{RF}-2f_{IF}$) is out of the GSM band so it can be filtered by suitable RF filters. The IF signal thus obtained is then filtered by a band-pass filter in order to permit the wanted signal to pass through while removing unwanted signals adjacent thereto. Thereafter, a second locally generated signal whose frequency corresponds to the frequency of the IF signal is mixed with the IF signal to generate the base-band signal. However, a significant drawback of such a superheterodyne receiver is that the band-pass filter required can not be easily incorporated onto an integrated circuit and has a significant cost associated with it.

In order to overcome the above-mentioned drawback with a superheterodyne receiver, a direct down-conversion receiver has been proposed in which $f_{LO}$ is set to equal $f_{RF}$ such that the IF signal corresponds directly to the base-band signal which is desired. In this case only a low pass filter is required which can be formed on an integrated circuit as desired. However, the locally generated signal may itself get received by the aerial of the receiver and interfere with the wanted rf signal thus generating noise at dc within the base-band signal which will not be filtered by the low-pass filter. In a similar manner, any non-linear distortion on the signal (or on high level interfers) caused by non-linear components within the receiver may also cause an unwanted dc noise or second order AM components within the base-band signal which cannot be easily filtered out without adversely affecting the wanted base-band signal (N.B. the wanted base-band signal will also have a dc component).

Thus there is a need for a method and apparatus for performing radio communication which overcomes the drawbacks associated with the prior art referred to above.

SUMMARY OF THE INVENTION

According to a second aspect of the present invention, there is provided a method of modulating a carrier signal with a modulating signal and transmitting the modulated carrier signal thus formed, the method comprising the steps of generating a low frequency local oscillator signal, which can be mathematically described as having a fixed frequency of zero and a phase which varies in time according to a predetermined phase function; mixing the modulating signal with the low frequency local oscillator signal to generate a mixed signal; converting the mixed signal from a digital signal to an analogue signal; generating a high frequency local oscillator signal, which can be mathematically described as having a fixed frequency corresponding to the frequency of the carrier signal to be modulated and a phase which varies in time according to the predetermined phase function when delayed by a predetermined delay corresponding to the time taken for the signal to propagate between the first mixing step and the second mixing step; mixing the mixed signal with the high frequency local oscillator signal to generate a generated signal including both the wanted modulated carrier signal whose phase is not dependent on the predetermined phase function and a noise signal whose phase is dependent upon the predetermined phase function; and transmitting the generated signal.

According to a third aspect of the present invention, there is provided a radio receiver for receiving a wanted modulated radio frequency signal and demodulating it to recover the wanted modulating signal therefrom, the receiver comprising receiving means for receiving a radio frequency signal; a high frequency local oscillator for generating a high frequency local oscillator signal, which can be mathematically described as having a fixed frequency corresponding to the frequency of the carrier wave of the wanted modulated radio frequency signal and a phase which varies in time according to a predetermined phase function; an analogue mixer for mixing the received radio frequency signal with the high frequency local oscillator signal to generate a mixed signal; an analogue to digital converter for converting the mixed signal from an analogue signal into a digital signal; a low frequency local oscillator for generating a low frequency local oscillator signal, which can be mathematically described as having a fixed frequency of zero and a phase which varies in time according to the predetermined phase function when delayed by a predetermined delay corresponding to the time taken for the signal to propagate between the analogue mixer and the digital mixer; and a digital mixer for mixing the mixed signal with the low frequency local oscillator signal to recover a recovered signal including both a wanted base-band signal whose phase is not dependent on the predetermined phase function and a noise signal whose phase is dependent upon the predetermined phase function.

According to a fourth aspect of the present invention, there is provided a radio transmitter for modulating a carrier signal with a modulating signal and transmitting the modulated carrier signal thus formed, the transmitter comprising a low frequency local oscillator for generating a low frequency local oscillator signal, which can be mathematically described as having a fixed frequency of zero and a phase which varies in time according to a predetermined phase function; a digital mixer for mixing the modulating signal with the low frequency local oscillator signal to generated a mixed signal; a digital to analogue converter for converting the mixed signal from a digital signal to an analogue signal; a high frequency local oscillator for generating a high frequency local oscillator signal, which can be mathematically described as having a fixed frequency corresponding to the frequency of the carrier signal to be modulated and a phase which varies in time according to the predetermined phase function when delayed by a predetermined delay corresponding to the time taken for the signal to propagate between the digital mixer and the analogue mixer; an analogue mixer for mixing the mixed signal with the high frequency local oscillator signal to generate a generated signal including both the wanted modulated carrier signal whose phase is not dependent on the predetermined phase function and a noise signal whose phase is dependent upon the predetermined phase function; and transmitting means for transmitting the generated signal.

The receiving and demodulating method preferably includes the step of filtering the recovered signal to remove unwanted components from the recovered signal including at least some of the noise whose phase is dependent upon the predetermined phase function. By this method, it is possible to remove more of the noise generated after the first mixing stage than would be the case if the phase of the noise signal was independent of the predetermined phase function.

Note that reference to a mixer above will generally be understood in the art to refer to a mixer arrangement which will usually include at least two mixers so that separate mixing can be performed on the I and Q signals and/or so that signal balancing may be performed at baseband.

Preferably, a signal corresponding to the predetermined phase function is generated digitally by a phase function generator in the form of a digital processor and/or suitable digital storage means. The high frequency local oscillator is preferably a digitally controlled frequency synthesiser and ideally is a fractional-N, Phase Locked Loop (PLL) frequency synthesiser, in combination with the phase function generator. The low frequency oscillator is preferably formed simply by the phase function generator itself.

In one preferred embodiment, the predetermined phase function varies with time in a non-linear fashion so as to spread the band-width of the signal with which it is mixed. Ideally the predetermined phase function further acts to spread the signal with which it is mixed in such a way that more of the signal power is moved to the edges of the spreaded frequency band than remains in the central portion of the spreaded frequency band. In this way it is possible to spread a significant fraction of the noise generated between the first and second mixing stages which would normally exist at the centre of the frequency band of the output signal (i.e. at dc in the case of a receiver or at the frequency of the unmodulated carrier signal in the case of a transmitter) to outside the frequency band of the output signal where it can be easily filtered.

A significant advantage of using either type of spreading phase function is that at least some of the components used in the signal path (e.g. the analogue to digital or digital to analogue converters) can be used to process both a narrow band signal (such as is found in the GSM protocol) and a wide band signal (such as may be found in a wide-band CDMA protocol).

BRIEF DESCRIPTION OF THE DRAWINGS

In order that the present invention may be better understood, embodiments thereof will now be described by way of example only, with reference to the accompanying drawings in which.

DETAILED DESCRIPTION

Figure 1:
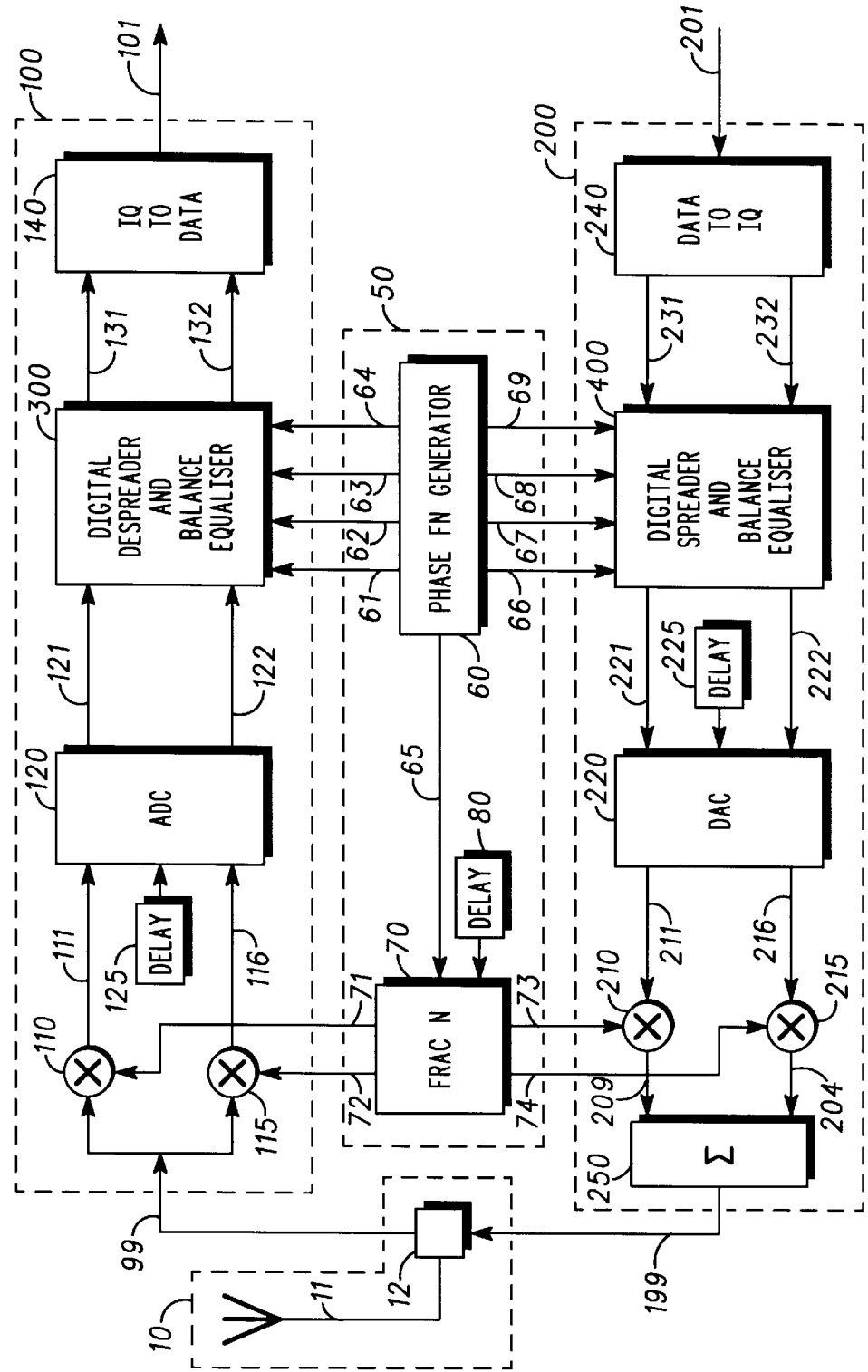
FIG. 1 is a block diagram of a radio transceiver according to the present invention.

Referring firstly to FIG. 1, transceiver 1 comprises a common transmitting and receiving means 10, local oscillator means 50, a receive path 100 and a transmit path 200. It will be understood by a person skilled in the art that FIG. 1 is schematic only and a large number of components which are not essential to the understanding of the present invention have been omitted for the sake of clarity; none-the-less, a skilled worker would have no difficulty in constructing a suitable radio transceiver from the present description in combination with the drawings by reference to a suitable textbook such as, for example, "RF transceiver architectures for wireless communication handsets" (Ecole Polytechnique Federale de Lausanne, Christian Kermarrec).

Common transmitting and receiving means 10 comprises an aerial 11 and associated rf circuitry 12 for controlling the flow of rf signals to and from the aerial 11, and may for example include LNA, Power Amplifier, suitable filters, duplexer,etc. Common transmitting and receiving means 10 receives as an input the output signal 199 from the transmitting path 200, and has an output signal 99 which forms the input to the receiving path 100.

Local oscillator means 50 comprises a phase function generator 60, a Fractional N type PLL frequency synthesiser 70 such as that described in prior U.S. Pat. No. 5,111,162 ["Digital Frequency Synthesizer having AFC and Modulation Applied to Frequency Divider," Hietala et al.] and first delay control means 80. Phase function generator 60 generates a plurality of related low frequency signals 61–69 which will be described in greater detail below. Signal 65 is applied to the frequency synthesiser 70 while signals 61–64 are applied to the receiving path 100 and signals 66–69 are applied to the transmitting path 200. Frequency synthesiser 70 receives signal 65 together with a signal (not shown), which corresponds to the carrier signal, from a controlling processing unit, and generates first, second, third and fourth high frequency signals 71,72,73,74. First delay control means 80 acts to control the relative delay between the phase function signals 61–69 and the output signals 71,72,73,74 of the frequency synthesiser as is discussed in greater detail below.

Receive path 100 comprises an in-phase down-converting mixer 110, a quadrature-phase down-converting mixer 115, an Analogue to Digital Converter (ADC) 120, second delay control means 125, a digital despreader and balance equaliser 300 and an IQ to data converter 140. It will of course be appreciated that this receive path 100 is highly simplified and therefore omits a number of elements which would be required in an actual receive path of this nature such as a number of filters/amplifiers placed at various stages along the receive path. Such filters/amplifiers have been deliberately omitted for the sake of clarity since they are not important for an understanding of the present invention.

The in-phase and quadrature-phase down-converting mixers 110,115 receive output signals 71,72 respectively from the frequency synthesiser 70 together with the received modulated carrier signal 99, which is outputted, after any initial filtering and/or amplification has been performed, by the common receiving and transmitting means 10. Mixers 110,115 output an In-phase (I) 111 and a quadrature phase (Q) 116 analogue baseband signal. These signals are then input to the ADC 120 together with the output of the second delay control means 125. ADC 120 outputs an I digital signal 121 and a Q digital signal 122 which correspond to the input I and Q analogue signals 111,116 delayed by a certain amount of time which may be varied by the second delay control means 125.

Digital I and Q signals 121,122 are input to the digital despreader and balance equaliser 300, together with signals 61,62,63,64 output from the phase function generator 60. Digital despreader and balance equaliser 300 outputs despread and balanced digital I and Q signals 131,132; these I and Q signals 131,132 are then input to the IQ to data converter 140 which converts the input I and Q signals 131,132 to a digital data signal 101 which forms the output of the receiving path 100. The IQ to data converter 140 preferably takes the form of a look-up table or other well known means for performing IQ to data conversion. In between the digital despreader and balance equaliser 300 and the IQ to data converter 140, there will be one or more filtering/amplifying stages including at least a selectivity filter stage which will substantially remove any unwanted noise whose frequency falls outside the band-width of the wanted signal.

Transmitting path 200 comprises a data to IQ converter 240, a digital spreader and balance equaliser 400, a Digital to Analogue Converter (DAC) 220, a third delay control means 225, an in-phase up-converting mixer 210, a quadrature-phase up-converting mixer 215 and a summing means 250. Again, a number of signal processing elements such as filters/amplifiers have been omitted from the transmitting path 100 of FIG. 1 for the sake of clarity since they are not essential for an understanding of the present invention.

A data signal 201 to be transmitted forms the input signal to the transmitting path 200 and is inputted to the data to IQ converter 240 which generates digital I and Q signals 231,232 which correspond to the data signal 201 to be transmitted. Digital I and Q signals 231,232 are input to the digital spreader and balance equaliser 400 together with signals 66,67,68,69 output from the phase function generator 60. The digital spreader and balance equaliser 400 outputs spreaded and balanced digital I and Q signals 221,222 which are inputted to the DAC 220 together with the output from the third delay control means 225.

DAC 220 outputs an I analogue signal 211 and a Q analogue signal 216 which correspond to the input I and Q digital signals 221,222 delayed by a certain amount of time which may be varied by the third delay control means 225. The analogue I signal 211 is input to the in-phase up-converting mixer 210 together with high frequency signal 73 from the frequency synthesiser 70. Similarly, the analogue Q signal 216 is input to the quadrature-phase up-converting mixer 215 together with high frequency signal 74 from the frequency synthesiser 70. Up-converting mixers 210,215 output high frequency despreaded analogue I and Q signals 209 and 204 respectively and these signals are summed together by the summing means 250, to generate an analogue carrier signal 199, which is modulated by the input data signal 201, which signal is inputted to the common receiving and transmitting means 10 for transmission thereby.

Figure 2:
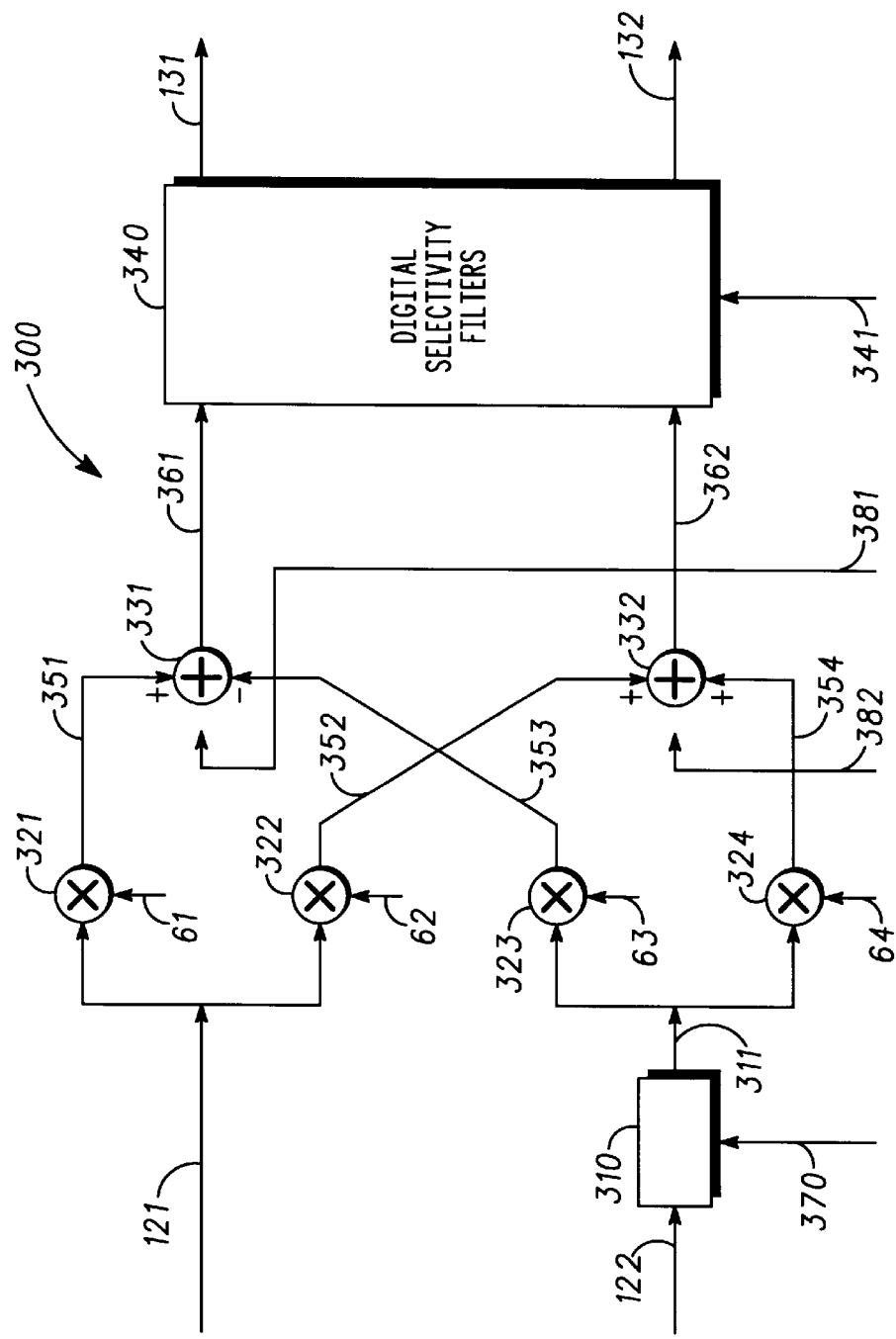
FIG. 2 is a block diagram of the digital despreader and balance equaliser block of FIG. 1.

Referring now to FIG. 2, an implementation of the digital despreader and balance equaliser 300 of FIG. 1 comprises a receive Q signal gain adjustment means 310, a first 321, second 322, third 323 and fourth 324 despreading multiplier, a first 331 and second 332 despreading adder/subtractor and a digital selectivity filter 340.

Q signal gain adjustment means 310 receives digital Q signal 122 and a Q signal gain adjustment signal 370 and outputs an adjusted gain Q signal 311. First despreading multiplier 321 receives the digital I signal 121 together with the first phase function signal 61 from the phase function generator 60 and outputs a signal 351 which is applied to a first input of the first despreading adder/subtractor 331. The second despreading multiplier 322 also receives the digital I signal 121 together with the second phase function signal 62 from the phase function generator 60 and outputs a signal 352 which is applied to a first input of the second despreading adder/subtractor 332. The third despreading multiplier 323 receives the adjusted gain Q signal 311 together with the third phase function signal 63 from the phase function generator 60 and outputs a signal 353 which is applied to a second input of the first despreading adder/subtractor 331. The fourth despreading multiplier 324 also receives the adjusted gain Q signal 311 together with the fourth phase function signal 64 from the phase function generator 60 and outputs a signal 354 which is applied to a second input of the second despreading adder/subtractor 332.

The inputs of the first despreading adder/subtractor 331 are arranged to generate an output signal 361 which is the difference between the two input signals 351,353. The inputs of the second despreading adder/subtractor 332 are arranged to generate an output signal 362 which is the sum of the two input signals 352,354. The nature of each of the inputs (whether they are inverting or non-inverting) of the first and second despreading adder/subtractors 331,332 in this particular embodiment is controllable by first and second despreading control signals 381,382 respectively to enable the outputs of the adder/subtractors to be inverted or not as desired (i.e. for one state of control signal 381 the first adder/subtractor's first input is inverting while its second input is non-inverting, and for an alternative state of control signal 381 the natures of the first and second inputs are swapped; similarly for one state of the second control signal 382 both inputs to the second adder/subtractor 332 are non-inverting but for an alternative state of control signal 382 both inputs are inverting).

The overall mathematical processing of the digital despreader and balance equaliser is modelled by the following vectorial equation:

$$V_{OUT}=(I_{IN}+j.Ad.Q_{IN}.\exp(j.\phi_{OFF})).(\exp(\pm j.\phi_{SS}))$$

which is equivalent, when expressed in a more general form, to:

$$V_{OUT}=(I_{IN}+j.Q_{IN}.H_{COMP}).A_{SS}.(\exp(\pm j\phi_{SS}))$$

where $V_{OUT}$ is the signal output by the digital despreader and balance equaliser, Hcomp is the compensation of the balanced filters to compensate for any mismatch between the I and Q signal paths, $\phi_{SS}$ is the phase depsreading/spreading signal, $A_{SS}$ is the amplitude despreading/spreading (whose value is preferably controlled to take only either +1 or −1), Iin is the input I component signal and $Q_{IN}$ is the input Q component signal.

The ability to change the nature of the inputs to the adder/subtractors enables lo amplitude spreading and despreading to be performed (where the amplitude spreading signal $A_{SS}$ takes only ±1) in addition to phase spreading and despreading, however in certain applications such amplitude spreading will not be required in which case the nature of the inputs will be fixed and the control signals 381 and 382 will be absent.

The I and Q signals 361,362 output from the adder/subtractors 331,332 are then passed on to a digital filtering element 340 which includes a controllable selectivity filtering stage, the passed bandwidth of which is controllable by a filter control signal 341 which is applied to a third input of the digital filtering element 340. The digital filtering element 340 outputs the despread and balanced digital I and Q signals 131,132.

Figure 3:
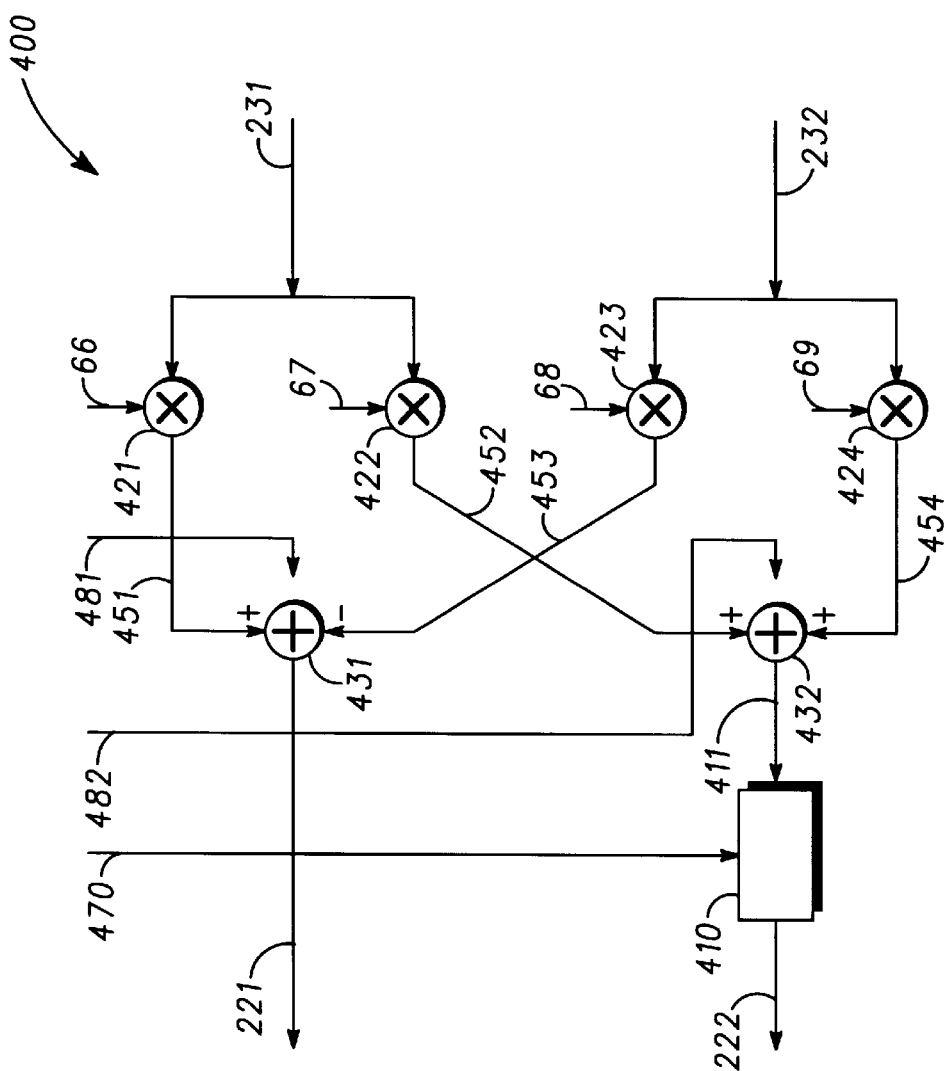
FIG. 3 is a block diagram of the digital spreader and balance equaliser block of FIG. 1.

Referring to FIG. 3, an implementation of the digital spreader and balance equaliser 400 of FIG. 1 comprises first 421, second 422, third 423 and fourth 424 spreading multipliers, first 431 and second 432 spreading adder/subtractors and a transmit Q signal gain adjustment means 410.

The digital spreader and balance equaliser 400 is substantially the converse of the digital despreader and balance equaliser 300. Thus, the first and second multipliers 421,422 both receive the digital I signal 231 to be transmitted at their first inputs while the third and fourth multipliers receive the corresponding digital Q signal 232 at their first inputs. At their second inputs, the first, second, third and fourth multipliers 421,422,423,424 receive, respectively, the sixth, seventh, eighth and ninth phase function signals 66,67,68,69 output by the phase function generator 60. The output signals 451,452,453,454 of the multipliers 421,422,423,424 are inputted respectively to the first input of the first adder/subtractor 431, the first input of the second adder/subtractor 432, the second input of the first adder/subtractor 431 and the second input of the second adder/subtractor 432.

As with the digital despreader and balance equaliser 300, the implementation of the digital spreader and balance equaliser 400 of FIG. 3 is such that the inputs of the first spreading adder/subtractor 431 are arranged to generate an output signal 221 which is the difference between the two input signals 451,453, and the inputs of the second spreading adder/subtractor 432 are arranged to generate an output signal 411 which is the sum of the two input signals 452,454. Furthermore, the nature of each of the inputs (whether they are inverting or non-inverting) of the first and second despreading adder/subtractors 431,432 in this particular embodiment is controllable by first and second spreading control signals 481,482 respectively to enable the outputs of the adder/subtractors to be inverted or not as desired (i.e. for one state of control signal 481 the first adder/subtractor's 431 first input is inverting while its second input is non-inverting, and for an alternative state of control signal 481 the natures of the first and second inputs are swapped; similarly for one state of the second control signal 482 both inputs to the second adder/subtractor 432 are non-inverting but for an alternative state of control signal 382 both inputs are inverting).

The output signal 221 from the first adder subtractor 431 forms the I signal input to the DAC 220 of FIG. 1. The output signal 411 of the second adder/subtractor 432 is input to the transmit Q signal gain adjustment means 410 together with a gain adjustment signal 470. The output signal 222 from the gain adjustment means 410 forms the gain adjusted Q signal input to the DAC 221 of FIG. 1.

The operation of the transceiver of FIG. 1 will now be described with reference to FIGS. 1, 2 and 3 in terms of a simplified mathematical expression of the signals pasing through the transceiver. Bearing in mind the following well known expressions:

$$\cos A \cdot \cos B = \tfrac{1}{2} \cos(A+B) + \tfrac{1}{2} \cos(A-B)$$

$$\cos A \cdot \sin B = \tfrac{1}{2} \sin(A+B) - \tfrac{1}{2} \sin(A-B)$$

$$\sin A \cdot \cos B = \tfrac{1}{2} \sin(A+B) + \tfrac{1}{2} \sin(A-B)$$

$$\sin A \cdot \sin B = \tfrac{1}{2} \cos(A-B) - \tfrac{1}{2} \cos(A+B)$$

and given that the first to fourth and sixth to ninth signals 61–64, 66–69 output by the phase function generator 60 are given by:

$P_{61} = \cos \phi_{SS}$ $P_{62} = \sin \phi_{SS}$ $P_{63} = \sin(\phi_{SS} + \phi_{OFF})$ $P_{64} = \cos(\phi_{SS} + \phi_{OFF})$ $P_{66} = \cos \phi_{SS}$ $P_{67} = \sin(\phi_{SS} + \phi_{OFF})$ $P_{68} = \sin \phi_{SS}$ $P_{69} = \cos(\phi_{SS} + \phi_{OFF})$ Considering firstly the transmission of data, data 201 to be transmitted is input to the transmit path 200 where it is initially converted into digital I and Q signals 231,232 by the data to IQ converter. The digital I and Q signals may be considered as digital I and Q representations of a constant amplitude signal having a time-varying phase $\phi_W$. Thus the I and Q signals may be written:

$I_{231} = \cos \phi_W$ $Q_{232} = \sin \phi_W$

Referring now to FIG. 3, the output signals 451,452,453, 454 of the first 421, second 422 third 423 and fourth 424 multipliers can be expressed as:

$$M_{451} = \cos \phi_W \cdot \cos \phi_{SS} = \tfrac{1}{2} \cos(\phi_W + \phi_{SS}) + \tfrac{1}{2} \cos(\phi_W - \phi_{SS})$$

$$M_{452} = \cos \phi_W \cdot \sin(\phi_{SS} + \phi_{OFF}) = \tfrac{1}{2} \sin(\phi_W + \phi_{SS} + \phi_{OFF}) - \tfrac{1}{2} \sin(\phi_W - \phi_{SS} - \phi_{OFF})$$

$$M_{453} = \sin \phi_W \cdot \sin \phi_{SS} = \tfrac{1}{2} \cos(\phi_W - \phi_{SS}) - \tfrac{1}{2} \cos(\phi_W + \phi_{SS})$$

$$M_{454} = \sin \phi_W \cdot \cos(\phi_{SS} + \phi_{OFF}) = \tfrac{1}{2} \sin(\phi_W + \phi_{SS} + \phi_{OFF}) + \tfrac{1}{2} \sin(\phi_W - \phi_{SS} - \phi_{OFF})$$

The signals 221,411 output by the first and second adder/subtrators 431,432 are then given by:

$I_{221} = M_{451} - M_{453} = \cos(\phi_W + \phi_{SS})$ $Q_{411} = M_{452} + M_{454} = \sin(\phi_W + \phi_{SS} + \phi_{OFF})$ The Q signal 451 is then passed through the Q signal gain adjustment means 410 to generate the gain adjusted Q signal 222 given by:

$Q_{222} = A_d \cdot \sin(\phi_W + \phi_{SS} + \phi_{OFF})$ where Ad is the gain adjusted amplitude of signal 222. Thus it can be seen that both the phase and the gain of the quadrature signal can be adjusted to compensate for any differences between the I and Q paths between the digital spreader and balance equaliser 400 and the up-converting mixers 210,215, by selecting appropriate values for $\phi_{OFF}$ and Ad respectively; these values may be selected dynamically by a suitable controlling unit or preprogrammed and stored in a suitable storage means, ideally with different values for different circumstances (e.g. transmission channel, temperature,etc).

When the I and Q signals arrive at the up-converting mixers 210,215 they will have picked up some noise, including a dc component of noise. If it is assumed that the compensation of the Q signal has successfully ensured that the I and Q signals have the same amplitude (which is again considered to be unity for the sake of convenience) and have the correct quadrature phase difference at this point, and only the dc component of the noise is considered at this stage, the I 211 and Q 216 signals at this point may be expressed as:

$I_{211} = \cos(\phi_W + \phi_{SS}) + I_{NOISE}$ $Q_{216} = \sin(\phi_W + \phi_{SS}) + Q_{NOISE}$ The third and fourth high frequency signals 73,74 generated by the frequency synthesiser 70 (as a result of the signal 65 sent by the phase function generator 60 together with a selected channel frequency signal sent by a suitable controller) are given by:

$$LO_{73} = \cos(\omega_{RF} - \phi_{SS})$$

$$LO_{74} = -\sin(\omega_{RF} - \phi_{SS}) = \sin(\phi_{SS} - \omega_{RF})$$

Note, $\phi_{SS}$ is a function of time, and where it is a complicated function of time (i.e. where its first derivative with respect to time is non-constant) it is important that the term $\phi_{SS}$ appearing in the expressions for $LO_{73}$ and $LO_{74}$ corresponds as closely as possible to $\phi_{SS}$ appearing in the expressions for $I_{211}$ and $Q_{216}$ in terms of time. This is achieved by controlling the relative delays of the phase function $\phi_{SS}$ travelling either via the frequency synthesiser 70 (the delay along this path being controlled by the first delay control means 80) or via the digital spreader and balance equaliser 400 and the DAC 220 (the delay along this path being controllable by the third delay control means 225).

Also the digital phase generator could be predistorded to take into account the known introduced distorsion of the FRACN PLL LO (this distorsion is due to the bandwidth limitation of the FRACN PLL).

The output signals 209,204 of the up-converting mixers is therefore given by:

$$I_{209} = I_{211}.LO_{73} = [\cos(\phi_W + \phi_{SS}) + I_{NOISE}].\cos(\omega_{RF}.t - \phi_{SS}) = \frac{1}{2}.\cos(\omega_{RF} + \phi_W) + \frac{1}{2}.\cos(\omega_{RF}.t - \phi_W - 2\phi_{SS}) + I_{NOISE}.\cos(\omega_{RF}.t - \phi_{SS})$$

$$Q_{204} = Q_{216}.LO_{74} = [\sin(\phi_W + \phi_{SS}) + Q_{NOISE}].\sin(\phi_{SS} - \omega_{RF}.t) = \frac{1}{2}.\cos(\omega_{RF} + \phi_W) - \frac{1}{2}.\cos(\omega_{RF}.t - \phi_W - 2\phi_{SS}) - Q_{NOISE}.\sin(\omega_{RF}.t - \phi_{SS})$$

These two signals are then summed by summing means 250 (which may for example be a two-input high frequency amplifier) to generate the output signal of the transmit path 199 given by:

$$S_{199} = I_{209} + Q_{204} = $$
$$\cos(\omega_{RF} + \phi_W) + I_{NOISE} \cdot \cos(\omega_{RF} \cdot t - \phi_{SS}) - Q_{NOISE} \cdot \sin(\omega_{RF} \cdot t - \phi_{SS})$$

Thus it can be seen that the output signal 199 includes a modulated carrier wave signal portion as desired, together with a noise component whose frequency is dependent upon the phase function $\phi_{SS}$. Therefore by selecting a phase function $\phi_{SS}$ which generates a spread spectrum (of, in a preferred embodiment, approximately 5 times the channel bandwidth) the majority of the noise can be spread to outside the channel of interest, thus reducing the noise inside the channel of interest and therefore leading to a greater signal to noise ratio of the transmitted signal so far as a receiver is concerned.

Turning now to consider the reception of data, referring both to FIG. 1 and FIG. 2, the signal $S_{99}$ to be demodulated by the receive path 100 is output by the common receiving and transmitting means 10 after reception at the aerial 11 and suitable rf processing by the associated rf circuitry 12 of a received rf signal. Signal $S_{99}$ may be given by $S_{99} = \cos(\omega_{RF}.t + \phi_W)$ where noise initially received with the wanted signal has been ignored for the sake of clarity. This signal $S_{99}$ is then applied to both the in-phase 110 and quadrature-phase 115 down-converting mixers where it is mixed with the first 71 and second 72 to generate at the outputs of the mixers:

$$I_{111} = S_{99}LO_{71} = \cos(\omega_{RF} \cdot t + \phi_W) \cdot \cos(\omega_{RF} \cdot t - \phi_{SS})$$
$$= 1/2 \cos(\phi_W + \phi_{SS}) + 1/2\cos(2\omega_{RF} \cdot t + \phi_W - \phi_{SS})$$

$$Q_{116} = S_{99}LO_{72} = \cos(\omega_{RF} \cdot t + \phi_W) \cdot \sin(\omega_{RF} \cdot t - \phi_{SS})$$
$$= -1/2 \sin(\phi_W + \phi_{SS}) + 1/2\sin(2\omega_{RF} \cdot t + \phi_W - \phi_{SS})$$

These signals are then filtered, amplified and digitised (in no particular order) to derive digital signals $I_{121}$ and $Q_{122}$ given by $I_{121} = \cos(\phi_W + \phi_{SS}) + I_{NOISE}$ and $Q_{122} = -(1/Ad).\sin(\phi_W + \phi_{SS} + \phi_{OFF}) + (1/Ad).Q_{NOISE}$ where the magnitude of the in-phase signal $I_{121}$ has again been normalised for the sake of convenience. $I_{NOISE}$ and $Q_{NOISE}$ represent the dc components of noise picked up by the I and Q signals before reaching the digital despreader and balance equaliser 300. Such noise can for example arise as a result of leakage from the local oscillator 70 being added to the received signal and and therefore being downconverted by mixers 110 and 115 to an unwanted dc component.

It will be noted that because the in-phase and quadrature-phase signals travel along different paths between the mixers 110,115 and the digital despreader and balance equaliser 300, a phase offset $\phi_{OFF}$ and a difference in gain 1/Ad will have arisen between these signals. The relative gain difference 1/Ad is compensated by the gain adjustment means 310 which effectively multiplies the input signal $Q_{122}$ by the gain adjustment signal 370 to give:

$$I_{311} = Q_{122}Ad_{370} = -(1/Ad) \cdot Ad \cdot \sin(\phi_W + \phi_{SS} + \phi_{OFF}) + Q_{NOISE}$$
$$= -\sin(\phi_W + \phi_{SS} + \phi_{OFF}) + Q_{NOISE}$$

The output signals 351,352,353,354 of the first 321, second 322, third 323 and fourth 324 multipliers of despreader 300 are given by:

$$M_{351} = [\cos(\phi_W + \phi_{SS}) + I_{NOISE}] \cdot \cos^\phi_{SS}$$
$$= 1/2\cos^\phi_W + 1/2\cos(\phi_W + 2\phi_{SS}) + I_{NOISE} \cdot \cos^\phi_{SS}$$

$$M_{352} = [\cos(\phi_W + \phi_{SS} + I_{NOISE})] \cdot \sin^\phi_{SS}$$
$$= -1/2\sin^\phi_W + 1/2\sin(\phi_W + 2\phi_{SS}) + I_{NOISE} \cdot \sin^\phi_{SS}$$

$$M_{353} = [-\sin(\phi_W + \phi_{SS} + \phi_{OFF}) + Q_{NOISE}] \cdot \sin(\phi_{SS} + \phi_{OFF})$$
$$= -1/2\cos^\phi_W + 1/2\cos(\phi_W + 2\phi_{SS} + 2\phi_{OFF}) + Q_{NOISE} \cdot \sin(\phi_{SS} + \phi_{OFF})$$

$$M_{354} = [-\sin(\phi_W + \phi_{SS} + \phi_{OFF}) + Q_{NOISE}] \cdot \cos(\phi_{SS} + \phi_{OFF})$$
$$= -1/2\sin^\phi_W + 1/2\sin(\phi_W + 2\phi_{SS} + 2\phi_{OFF}) + Q_{NOISE} \cdot \cos(\phi_{SS} + \phi_{OFF})$$

(Note, in order to ensure that the term $\phi_{SS}$ appearing in the terms for $P_{61}$–$P_{64}$ corresponds to the term $\phi_{SS}$ appearing in the terms for $I_{121}$ and $Q_{311}$, it is neccessary for suitable delays to be created along a first path between the phase function generator 60 and the digital despreader and balance equaliser 300 via the local oscillator 70, mixers 110 and 115 and ADC 120 and a second path directly by signals 61–64. This is achieved by the phase function generator providing a coarse delay on signals 61–64 relative to signal(s) 65 and by providing fine delay control using the first and second delay control means 80, 125)

Also the digital phase generator could be predistorded to take into account the known introduced distorsion of the FRACN PLL LO (this distorsion is due to the bandwidth limitation of the FRACN PLL).

The signals 361,362 output by the first and second adder/subtractors 331,332 are then given by:

$$I_{361} = M_{351} - M_{353}$$
$$= \cos\phi_W + [1/2\cos(\phi_W + 2\phi_{SS}) - 1/2\cos(\phi_W + 2\phi_{SS} + 2\phi_{OFF})] + N$$
$$Q_{362} = M_{352} + M_{354}$$
$$= -\sin\phi_W + [1/2\sin(\phi_W + 2\phi_{SS}) - 1/2\sin(\phi_W + 2\phi_{SS} + 2\phi_{OFF})] + M$$

(Note the second term in both of the above expressions, in square brackets, will be relatively small compared to the wanted signal for a small value of $\phi_{OFF}$ and also it will be spread twice by $2\phi_{SS}$ which then will be filtered by the selectivity filters) N and M here represent the result of passing the dc noise components through the digital despreader and balance equaliser 300, the effect of which is to multiply the dc components by a varying frequency (controlled by $\phi_{SS}$) thus spreading what was a dc noise to frequencies throughout the spreaded signal bandwidth.

These signals are then passed through a digital selectivity filters stage 340 where any noise outside the bandwidth of the wanted signals are removed, including a large portion of the spreaded noise signals N and M. Note that the exact properties of the digital selectivity filters can be controlled by a suitable controlling unit such as a DSP or microcontroller and this is represented in FIG. 2 by control signal 341.

The output signals 131, 132 from the digital selectivity filters stage 340 are then the I and Q components of the wanted signal $V_{WANTED} = \exp(-j \cdot \phi_W)$ which are inputted to the IQ to data converter 140 which recovers the wanted data signal 101 which is output from the receive path 100.

What is claimed is:

1. A method of receiving a wanted modulated radio frequency signal and of demodulating it to recover the wanted modulating signal therefrom, the method comprising the steps of receiving a radio frequency signal; generating a high frequency local oscillator signal, which can be mathematically described as having a fixed frequency corresponding substantially to the frequency of the carrier wave of the wanted modulated radio frequency signal and a phase which varies progressively in time according to a predetermined local progressively-varying phase function; mixing the received radio frequency signal in a first mixing step with the high frequency local oscillator signal so as to down-convert and phase-spread locally the band-width of the signal with which it is mixed and generate a mixed base-band signal; converting the mixed base-band signal from an analogue signal into a digital signal; generating a low frequency local oscillator signal, and mixing the mixed base-band signal with the low frequency local oscillator signal in a second mixing step, said low frequency local oscillator signal being, mathematically describable, as having a fixed frequency of substantially zero and a phase which varies progressively in time according to the predetermined local progressively-varying phase function when delayed by a predetermined delay corresponding to the time taken for the signal to propagate between the first mixing step and the second mixing step; and wherein mixing the mixed base-band signal with the low frequency local oscillator signal in the second mixing step, recovers a recovered signal including both a wanted base-band signal whose phase is not dependent on the predetermined local progressively-varying phase function and a noise signal whose phase is dependent upon the predetermined local progressively-varying phase function.

2. A method as claimed in claim 1 wherein the predetermined local progressively-varying phase function varies with time in a non-linear progressively-varying fashion so as to phase-spread the band-width of the signal with which it is mixed.

3. A method as claimed in claim 2 wherein the predetermined local progressively-varying phase function is such that the bandwidth of the signal with which it is mixed is phase-spread in such a way that more of the signal power is moved to the edges of the spread frequency band than remains in the central portion of the spread frequency band, whereby a significant fraction of the noise generated between the first and second mixing stages is spread to outside the frequency band of the wanted modulating signal where it can be easily filtered out.

4. A method as claimed in claim 1 further including the step of filtering the recovered signal to remove unwanted components from the recovered signal including at least some of the noise whose phase is dependent upon the predetermined local phase function.

5. A radio receiver for receiving a wanted modulated radio frequency signal and demodulating it to recover the wanted modulating signal therefrom, the receiver comprising receiving means for receiving a radio frequency signal; a high frequency local oscillator for generating a high frequency local oscillator signal, which can be mathematically described as having a fixed frequency corresponding substantially to the frequency of the carrier wave of the wanted modulated radio frequency signal and a phase which varies progressively in time according to a predetermined local progressively-varying phase function; an analogue mixer for mixing the received radio frequency signal with the high frequency local oscillator signal so as to down-convert and phase-spread locally the band-width of the signal with which it is mixed and generate a mixed base-band signal; an analogue to digital converter for converting the mixed base-band signal from an analogue signal into a digital signal; a low frequency local oscillator for generating a low frequency local oscillator signal, a digital mixer for mixing the mixed base-band signal with the low frequency local oscillator signal, said low frequency local oscillator signal being, mathematically describable, as having a fixed frequency of substantially zero and a phase which varies progressively in time according to the predetermined local progressively-varying phase function when delayed by a predetermined delay corresponding to the time taken for the signal to propagate between the analogue mixer and the digital mixer; and wherein mixing the mixed baseband signal with the low frequency local oscillator signal in the digital mixer, recovers a recovered signal including both a wanted base-band signal whose phase is not dependent on the predetermined local progressively-varying phase function and a noise signal whose phase is dependent upon the predetermined local progressively-varying phase function.

6. A radio receiver according to claim 5 further comprising a local phase function generator for generating the predetermined progressively-varying phase function.

7. A radio receiver as claimed in claim 6 wherein the low frequency oscillator is formed by the local phase function generator.

8. A radio receiver as claimed in claim 6 wherein the local phase function generator includes a look-up table in which sample values of the predetermined local progressive-varying phase function are stored.

9. A radio receiver as claimed in claim 5 wherein the high frequency local oscillator comprises a digitally controlled frequency synthesizer in combination with the local phase function generator.

10. A radio receiver as claimed in claim 9 wherein the digitally controlled frequency synthesizer comprises a fractional-N type frequency synthesizer.

11. A radio receiver as claimed in claim 5 further comprising a digital despreader and balance equalizer, which includes the digital mixer, for performing IQ balancing in addition to signal despreading.

12. A radio receiver as claimed in claim 11 wherein the local progressively-varying phase function is predistorted to take into account the introduced distortion of the high frequency local oscillator.

* * * * *